US008530999B2

(12) United States Patent
Lerner et al.

(10) Patent No.: US 8,530,999 B2
(45) Date of Patent: Sep. 10, 2013

(54) SEMICONDUCTOR COMPONENT WITH ISOLATION TRENCH INTERSECTIONS

(75) Inventors: Ralf Lerner, Erfurt (DE); Uwe Eckoldt, Hohenfelden (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 12/999,658

(22) PCT Filed: Jun. 19, 2009

(86) PCT No.: PCT/EP2009/057706
§ 371 (c)(1),
(2), (4) Date: Apr. 11, 2011

(87) PCT Pub. No.: WO2009/153356
PCT Pub. Date: Dec. 23, 2009

(65) Prior Publication Data
US 2012/0098084 A1    Apr. 26, 2012

(30) Foreign Application Priority Data

Jun. 19, 2008 (DE) .......................... 10 2008 029 235

(51) Int. Cl.
*H01L 29/06* (2006.01)
(52) U.S. Cl.
USPC ............. 257/506; 257/510; 257/E21.545; 257/E29.02; 438/400; 438/207
(58) Field of Classification Search
USPC ................. 257/506, E29.02, E21.545, 510; 438/400, 207, 427, 270, 626
See application file for complete search history.

(56) References Cited

U.S. PATENT DOCUMENTS

| 5,283,461 | A | | 2/1994 | Beasom | |
| 5,683,075 | A | * | 11/1997 | Gaul et al. | 257/510 |
| 5,734,192 | A | | 3/1998 | Sengle et al. | |
| 6,168,996 | B1 | * | 1/2001 | Numazawa et al. | 438/270 |
| 6,394,638 | B1 | | 5/2002 | Sengle et al. | |
| 6,524,928 | B1 | | 2/2003 | Hirabayashi | |
| 6,737,346 | B2 | * | 5/2004 | Ireland | 438/626 |

FOREIGN PATENT DOCUMENTS

| DE | 102005059034 A1 | 6/2007 |
| DE | 102005059035 A1 | 6/2007 |
| EP | 0317786 A | 5/1989 |
| JP | 04127148 A | 4/1992 |
| JP | 4127148 A | 4/1992 |
| JP | 4263454 A | 9/1992 |

(Continued)

OTHER PUBLICATIONS

Lyons, Christopher; International Search Report for PCT/EP2009/057706; Oct. 2, 2009.

*Primary Examiner* — Thinh T Nguyen
(74) *Attorney, Agent, or Firm* — Stevens & Showalter LLP

(57) ABSTRACT

A semiconductor component with straight insulation trenches formed in a semiconductor material providing semiconductor areas laterally insulated from each other. Each insulation trench has a uniform width along its longitudinal direction represented by a central line. The semiconductor component has an intersecting area into which at least three of the straight insulation trenches lead. A center of the intersecting area is defined as a point of intersection of the continuations of the center lines. A central semiconductor area disposed in the intersecting area is connected with one of the semiconductor areas and contains the center of the intersecting area.

20 Claims, 10 Drawing Sheets

(56) References Cited

FOREIGN PATENT DOCUMENTS

| | | |
|---|---|---|
| JP | 04263454 A | 9/1992 |
| JP | 04274344 A | 9/1992 |
| JP | 4274344 A | 9/1992 |
| JP | 10135319 A | 5/1998 |
| JP | 10308443 A | 11/1998 |
| JP | 2008130826 A | 6/2008 |
| WO | 2005074021 A | 8/2005 |
| WO | 2005074021 A1 | 8/2005 |

* cited by examiner

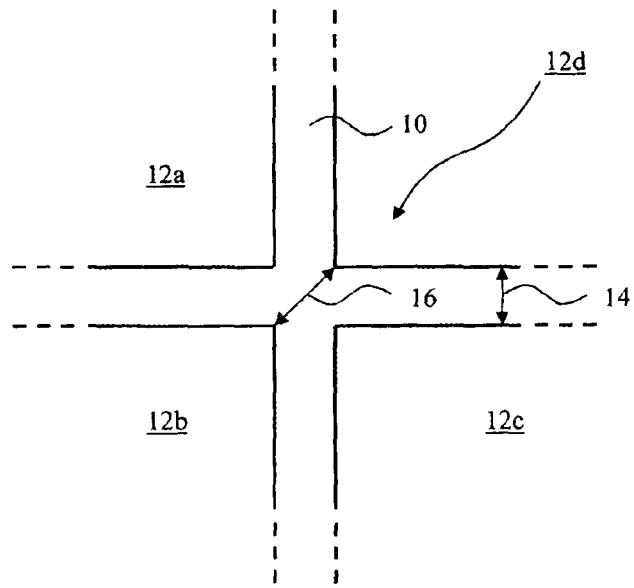
Fig. 1a -- Prior Art
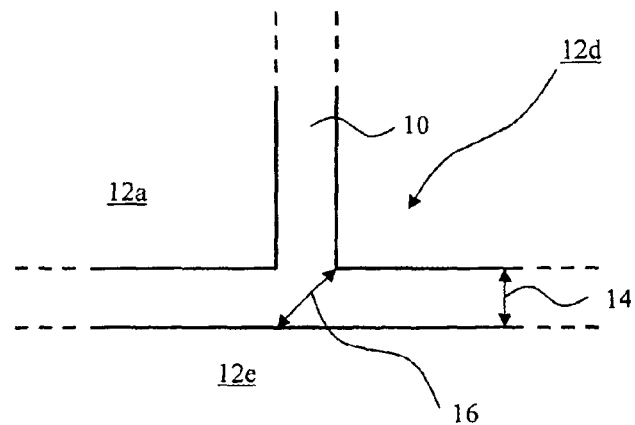
Fig. 1b - Prior Art

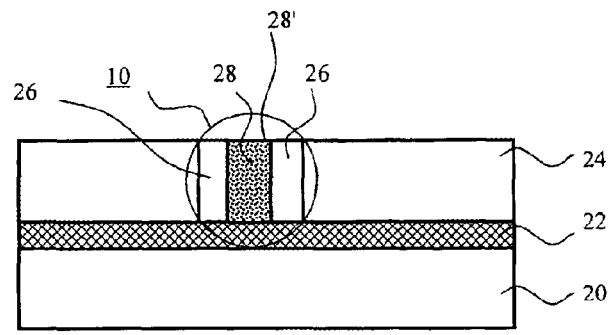
Fig. 2 - Prior Art
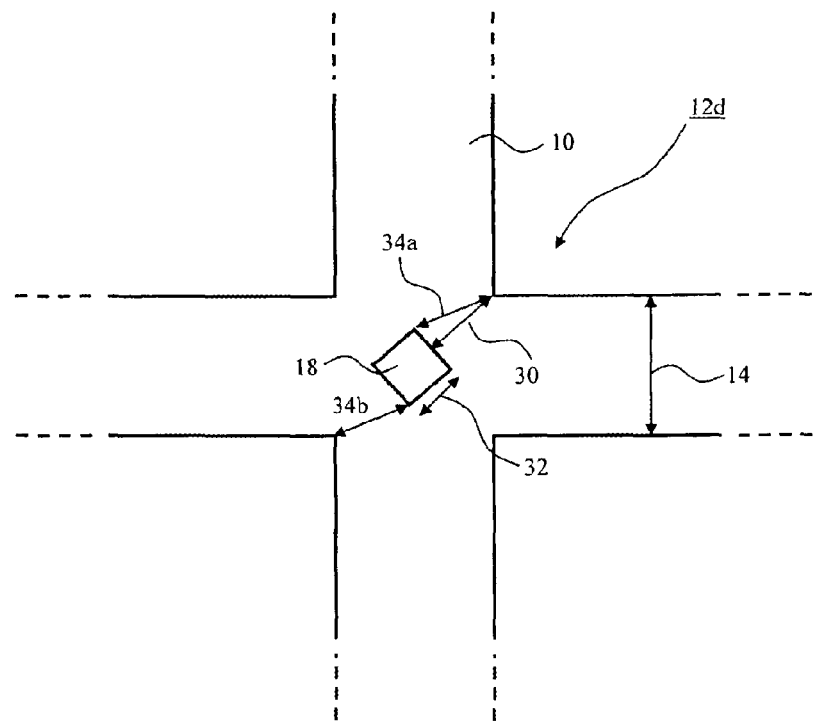
Fig. 3 - Prior Art

US 8,530,999 B2

SEMICONDUCTOR COMPONENT WITH ISOLATION TRENCH INTERSECTIONS

FIELD OF THE INVENTION

The invention relates to the geometrical design (as a layout) of points of intersection or junctions of several insulation trenches, also commonly referred to as isolation trenches, at a meeting point, e.g. for trench-insulated smart power technologies, in which trenches with a high aspect ratio with thick active layers in the range around 50 μm are to be provided in SOI silicon wafers. A meeting point is a junction zone in which at least three insulation trenches meet as trenches by means of a junction. A junction has three meeting trenches or an intersection has at least four meeting trenches. Two trenches alone are no meeting point, but a continuous trench.

BACKGROUND OF THE INVENTION

Insulation trenches in silicon wafers, e.g. in SOI silicon wafers, are used in order to electrically insulate areas which are at a different potential and comprise different components (e.g. transistors) or complete circuit blocks which are at a different potential from each other. Here, the insulation trench may e.g. enclose the component to be insulated or the area to be insulated in an annular fashion as this is e.g. illustrated by U.S. Pat. No. 5,734,192 A or U.S. Pat. No. 6,394,638 B1. A trench structure is described in U.S. Pat. No. 5,283,461 A, in which the components to be insulated are separated by a network of insulation trenches.

FIG. 1a shows a relevant arrangement of insulation trenches. There the insulation trench 10 with a width 14 is in each case surrounded on both sides by insulated islands 12a to 12d. If, as shown in FIG. 1a, cross-shaped or, as shown in FIG. 1b, T-shaped "meeting points" of the insulation trenches 11 develop, a diagonal width 16 of the insulation trench is formed at the "point of intersection". Here, the diagonal width 16 at the meeting point is substantially greater (root from double the square of the width 14) than the width 14 of each individual insulation trench that extends in a straight line; with a width "a" for both trenches the maximum distance is approx. 1.4 times greater than the width of each trench. With the T meeting point the insulated areas are 12a, 12d and the larger area is 12e.

U.S. Pat. No. 6,524,928 B1, cf. FIG. 2, e.g. describes the structure of the insulation trench 10. The starting material is the SOI wafer consisting of a carrier disk 20, the active SOI layer 24 and the buried oxide 22 which insulates the carrier disk 20 from the active SOI layer 24 used for active components. At first, an insulation layer 26, e.g. a silicon dioxide as a dielectric, is applied onto the side walls of the etched insulation trench. Subsequently, the insulation trench is filled with a filling material 28, e.g. polysilicon, and leveled at the surface 28'.

The deposition of the filling layer 28 for filling the insulation trench is e.g. carried out by means of chemo-physical deposition processes (CVD or PVD processes). Since the insulation trench is filled up from both trench sides in the deposition of the filling layer, a layer thickness of at least half the width 14 is theoretically necessary in order to fill the straight insulation trench without points of intersection. However, this is not sufficient for a complete filling of the entire insulation trench; since the intersection area and, thus, the diagonal 16 must also be taken into consideration for a complete filling. Thus, the layer thickness required for this is at least half the width 16 and, thus, is substantially greater than the layer thickness which would be required for filling the trench width 14. However, a greater layer thickness means longer process times and, thus, higher process costs.

It is desirable to obtain a layout of the insulation trench with a minimum width in order to be able to already fill the trench with smaller layer thicknesses (with lower deposition times and thus lower costs). On the other hand, a certain aspect ratio and, thus, a minimum width of the trench with a given thickness of the active layer is required for a stable etching process of the trench. Thus, the requirement of a minimum width cannot be complied with by a simple reduction of the width of an insulation trench.

Structures are described in DE 10 2005 034 A1 and DE 10 2005 059 035 A1 (Lerner, Eckoldt, X-Fab AG), in which the width 16 is locally reduced at the point of intersection due to the fact that a central island "raised in a column-shaped fashion" remains during the trench etching. Due to this, the diagonal is reduced in the intersection area and less polysilicon is required for completely filling the trench everywhere.

In the case of greater layer thicknesses of the active layer, e.g. silicon layer, of e.g. 50 μm and more, in which the width of the trench 14 is typically only a few micrometers, e.g. 3 μm to 4 μm, a column with a height of 50 μm (and more) and a width 32 of only about 2 μm would be required as the central island. Thus, the requirement results for the trench etching process that a so-called notching must absolutely be avoided, where due to the backscatter of the etching ions of the charged, buried oxide in the side wall of the trench at the low end of the side wall of the trench is laterally etched. Otherwise, the low end of the central island would be slightly etched and/or the central island would be completely etched free. Even with an—assumed—perfect trench etching such a central island with a low end area of about 2 μm by 2 μm and a height of 50 μm is mechanically very sensitive.

SUMMARY OF THE INVENTION

The object of the invention consists in indicating an arrangement for an intersecting area of the insulation trench (as an intersection or junction), which eliminates the risks of a lateral etching of central islands remaining in the meeting point (junction zone). A width of the insulation trench, which is as homogeneous as possible, in the intersecting area is to be achieved with a homogeneous etching of the insulation trench.

The object is attained by a semiconductor component and also by a design structure which represents the semiconductor component during the design phase.

The semiconductor element or the design structure representing it comprises and/or represents straight insulation trenches which are formed or must be formed in a semiconductor material and produce in the same semiconductor areas being separated from each other, each insulation trench having a set uniform width along its longitudinal direction which can be represented by a central line. Moreover, an intersecting area is provided which is adjoined by the at least three of the straight insulation trenches. This is the "meeting point" in the sense of the initial disclosure. A center of the intersecting area is defined as the point of intersection and the continuations of the central lines of the insulation trenches. A central semiconductor area is disposed or must be disposed in the intersecting area and is connected or must be connected with one of the semiconductor areas that are laterally separated from each other. It includes the center of the intersecting area.

Due to this design of the semiconductor component the widths which occur in the intersecting area (meeting point) and are to be filled are reduced, a mechanical coupling of the central semiconductor area at one of the semiconductor areas laterally separated from each other taking place at the same time so that the mechanical stability of the meeting point is preserved after the etching. On the other hand, the resultant distances may be generated within the intersecting area such that similar insulation properties as in the straight insulation trenches leading to the meeting point are achieved.

Roughly speaking, an island is no longer placed in the junction area (as the meeting point), but a peninsula is provided; it has a material connection with one of the areas which are laterally insulated from each other by the trenches. The peninsula projects towards the center of the junction area, i.e. it has a minimum extension as regards the length. The peninsula is not connected with any further area of the insulated areas (which are also called islands).

In further embodiments the insulation trenches have a ratio of trench depth to trench width which is ten or higher so that the structures and components of the present invention are in particular suited for smart power applications.

In further embodiments of the semiconductor component or its design structure a thickness of 50 μm or more is provided for the semiconductor material. In further embodiments a buried insulating layer is provided on which the semiconductor material is formed (semiconductor) or must be formed (design structure).

The measures described above are especially advantageous in connection with demanding smart power applications, since a high insulation strength is achieved.

In a further embodiment the shortest distance of the central semiconductor area of each of the (insulated) semiconductor areas laterally separated from each other is smaller than half the width of the insulation trench with the greatest width. Thus it is achieved that the necessary thickness of a filling material is only determined by the geometrical design of the trenches even if the trenches with different width are present. In other embodiments of this design the insulation trenches have nevertheless the same width.

In further embodiments the intersecting area is an intersection which is adjoined by the four insulation trenches. In this connection it must be borne in mind that within the framework of the claimed invention an insulation trench must be considered as a straight section which leads into the intersecting area with one end. Here, the end of the insulation trench is there where a section transversely to the trench still has the same width as the preceding portion of the trench. The width is changed after the cross-section or there is a wall bent to the straight portion at least at one side.

In a further embodiment the central semiconductor area projects as an intersection web starting from one corner of the intersection into the center of the intersection, which is connected with one of the semiconductor areas laterally separated from each other at one corner of the intersection, whereas the corners of the other three semiconductor areas laterally separated from each other are separated by this web in the intersection. This design of the intersecting areas only requires a very small deviation of intersections without central island so that very similar insulation properties are achieved, a reduced deposition thickness being, however, sufficient.

In one variant the semiconductor areas laterally separated from each other have pointed corners at the intersection and the intersection web has a rectangular shape with a width and distances between the pointed corners of the semiconductor areas laterally separated from each other and the pointed corners of the intersection web are smaller or of equal size, based on the width of the insulation trenches. Thus, the intersecting area results without substantial changes as regards the corners of the separated semiconductor areas.

In a further embodiment the semiconductor areas laterally separated from each other are chamfered in the intersection and the central semiconductor area as the intersection web has a rectangular shape with a width, the chamfers extending in parallel to straight sides of the intersection web and distances in the intersection between the chamfers of the semiconductor areas laterally separated from each other and the straight sides of the intersection web are smaller or of equal size, based on the width of the insulation trench. Due to the chamfer field intensity peaks are attenuated so that a reduction of the insulation distances possibly present in the intersecting area (as a meeting point) does not have any detrimental implications.

In a further embodiment the semiconductor areas laterally separated from each other have pointed corners in the meeting point and the central semiconductor area as an intersection web has an inhomogeneous width. Here, the web portion located in the center of the intersection has a square or rectangular shape with a width and pass into to a narrower web portion. The distances between the pointed corners of the semiconductor areas laterally separated from each other and the pointed corners of the intersection web portion are smaller or of equal size, based on the width of the insulation trench. Due to this design an enlargement of the central semiconductor area in the center is achieved without excessive semiconductor material being contained in the intersecting area.

In a further embodiment the semiconductor areas laterally separated from each other are chamfered in the intersection and the central semiconductor area in the form of an intersection web has an inhomogeneous width so that a web portion located in the center of the intersection has a square or rectangular shape with a width and passes over into a narrower web portion and the chamfers extend in parallel to the straight sides of the intersection web portion and distances in the intersection between the chamfers of the semiconductor areas laterally separated from each other and the straight sides of the intersection web portion are smaller or of equal size, based on a width of the insulation trench. In this case the advantageous filling behavior is achieved by a lesser expenditure of material for the central area, the rounded corners resulting in a low resultant electrical field.

In other embodiments the intersecting area (junction zone, meeting point) is a junction, into which not more than three insulation trenches lead. Preferably a T-shape results.

In a variant of the junction as the meeting point the central semiconductor area is formed or must be formed as a web-like bulge whose longitudinal direction is oriented towards a joining insulation trench.

In a further embodiment of the junction the shape of the central area is adapted to the shape of a corner zone of one of the semiconductor areas being separated from each other (insulated with respect to each other), in particular flat at the front side with a flattened corner zone.

According to the invention a thickness of the filling layer is only still required for the complete filling of a junction zone formed in this fashion, which corresponds to at least half the trench width of the broadest trench. Due to this the entire insulation trenches and also the intersecting area can be completely filled with a minimum thickness of the deposited filling layer. Minimum thickness means in turn a minimum process time and this means in turn a reduced error rate with minimally possible process costs for the filling step.

Thus, the local diagonal width of the insulation trenches in a point of intersection or junction (let's say: the junction zone or the meeting point) can be reduced e.g. for individual switching elements in relatively thick active layers in the magnitude of about 50 μm (or thicker) and, nevertheless, an insulation width of the junction zone, which is as equal as possible and outside this zone is obtained. The trenches can be completely filled with an expenditure being as small as possible during the deposition of the filling layer.

BRIEF DESCRIPTION OF THE DRAWINGS

Now the invention is explained by means of examples with the aid of the drawing. The Figs. show the following in a schematic representation:

FIG. 1a is an intersection of insulation trenches according to the prior art;

FIG. 1b is a junction of insulation trenches according to the prior art;

FIG. 2 is a cross-section of a known insulation trench 10 according to the prior art;

FIG. 3 is an intersection of insulation trenches with a central island according to the prior art;

DETAILED DESCRIPTION OF THE INVENTION

Figure 4:
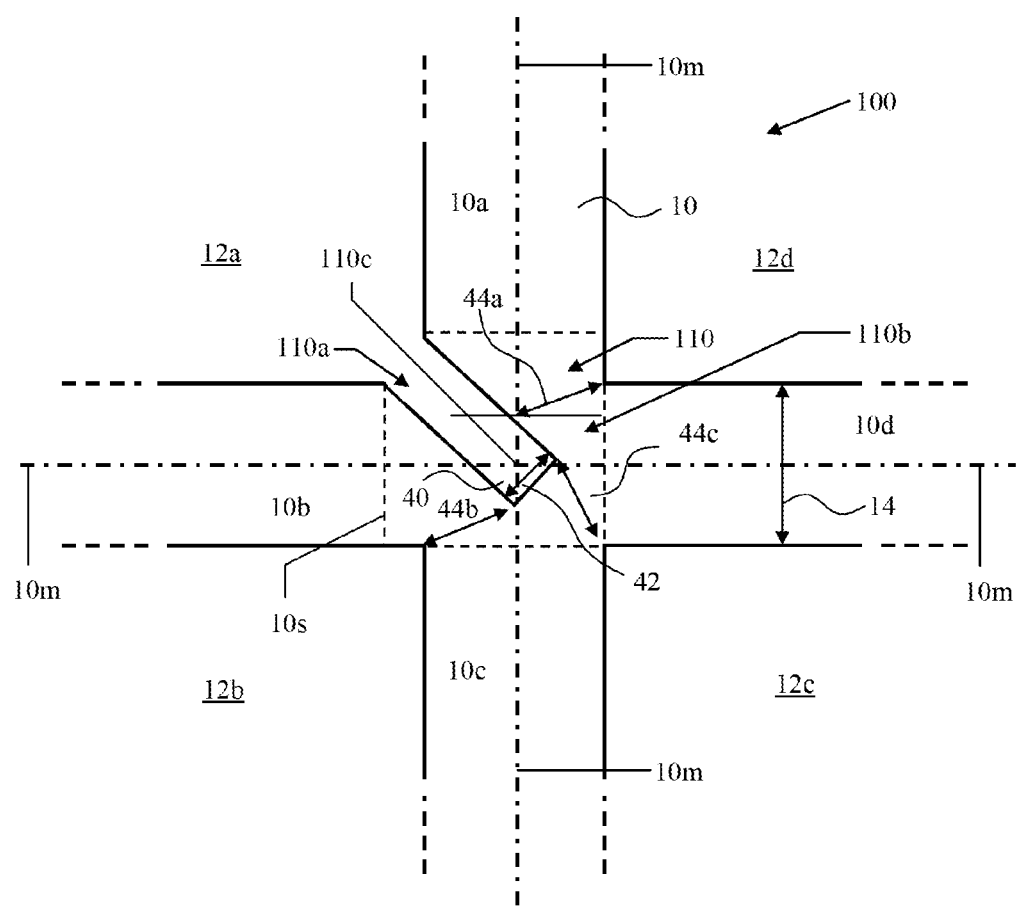
FIG. 4 is an example of an intersection of insulation trenches with pointed corners and rectangular intersection web, which is formed according to an aspect of the invention.

Further examples of the invention are described in the following with reference to FIGS. 4 to 8, reference being also made to FIGS. 1 to 4, if this is appropriate.

FIG. 2 shows a vertical section through one of the insulation trenches 10 circumscribed. in the following with respect to FIGS. 4 to 8. The starting material is in each case an SOI wafer consisting of a carrier disk 20, the (thick) active layer 24 (semiconductor layer 24) and the buried oxide 22 which insulates the carrier disk 20 with respect to the active layer 24 used for active components. At first, one insulation layer 26 each, a silicon dioxide is applied onto the side walls of the etched insulation trench e.g. as a dielectric. Subsequently, the remaining content of the insulation trench is filled with a filling material 28, e.g. polysilicon, and leveled at the surface 28'.

The deposition of the filling layer 28 for filling the insulation trench is carried out, e.g. by means of chemo-physical deposition processes (CVD or PVD processes). Since the deposition of the filling layer of the insulation trench is filled from both trench sides, a layer thickness of at least half the width 14 is theoretically required in order to fill the straight insulation trench without points of intersection.

FIG. 4 shows a schematic top view of a semiconductor component 100 or a design structure of the semiconductor component 100, for instance in the form of a layout which serves as a model for the production of the component. In the following the semiconductor component is understood by the reference numeral 100, which has individual circuit elements such as transistors, capacitors, resistors and the like as this was also already described at the beginning.

The semiconductor component 100 comprises insulation trenches 10 which must be understood as straight sections with a constant width 14. Thus, four insulation trenches 10a, 10b, 10c, 10d are shown in FIG. 4.

One end of an insulation trench must be understood as that section 10s of which the width 14 is changed in the direction towards that intersecting area 110 and/or the respective trench 10 is no longer straight at least at one edge. The width is e.g. changed for the trenches 10a and 10b at the section 10s, since a side wall of the trench extends further in the direction towards the intersecting area 110 in an angled fashion. A center 110c of the intersecting area 110 is determined by the section of central lines 10m and/or their continuations for each of the insulation trenches 10. The improved filling behavior in combination with a more stable mechanical structure is achieved by the provision of a central semiconductor area 110a which is connected with one of the semiconductor areas 12 laterally separated from each other by the insulation trenches 10a to 10d and contains the center 110c.

In the shown embodiment the semiconductor area 12a is connected with the central area 110a and/or the central area 110a is a part of the insulated area 12a (along the lines of a peninsula with a minimum extension into the center 110c of the meeting point (of the junction zone)).

The other insulated areas are 12b, 12c and 12d. Frequently, they are also jointly called 12. Two areas each are insulated with respect to each other by an insulation trench, e.g. the area 12b with respect to the area 12c by the trench 10c.

In the shown embodiment a part 40 designed in a web-shaped fashion as the area 110a with a width 42 projects from a corner of the intersecting area 110, which, in this case, is designated as intersection due to the four adjoining insulation trenches 10, into the center of the intersection. This "intersection web" 40 is connected with the laterally separated semiconductor area 12a at one corner of the intersection 110, it being possible to also designate it as island. As explained above with reference to FIG. 2, an SOI structure is considered in a few embodiments, in which the "islands" 12, are formed on a buried layer as 12a, 12b 12c 12d (levorotatory), e.g. the layer 22 of FIG. 2. The other three corners of the further semiconductor areas 12 and/or insulated islands 12 of the intersection are separated from this web by trenches 110b in the intersecting area 110 from the area 110a and thus the area 12a with a maximum width 44a to 44c. Due to this, the width of the insulation trench 110b to be filled within the intersecting area 110 to the width 44a, 44b and 44c is reduced and correspondingly thinner layers can be used for filling the intersecting area 110 and the insulation trenches 10.

However, the width 44 cannot be designed optionally small in order to avoid influences on the etching rate during trench etching and the production of the trench insulation layer. To achieve a good mechanical stability the width 42 of the intersection web 40 should be as large as possible. To achieve a homogeneous trench etching the widths 44a and 44b to the side of the web 40 in the intersecting area should at least correspond to the width 14 of the trench 10 outside the intersection. Consequently, the width 44c at the front side of the intersection web 40 may be smaller. Due to the shape of the web the undercutting with respect to an island is substantially reduced in the thicker active layers.

Figure 5:
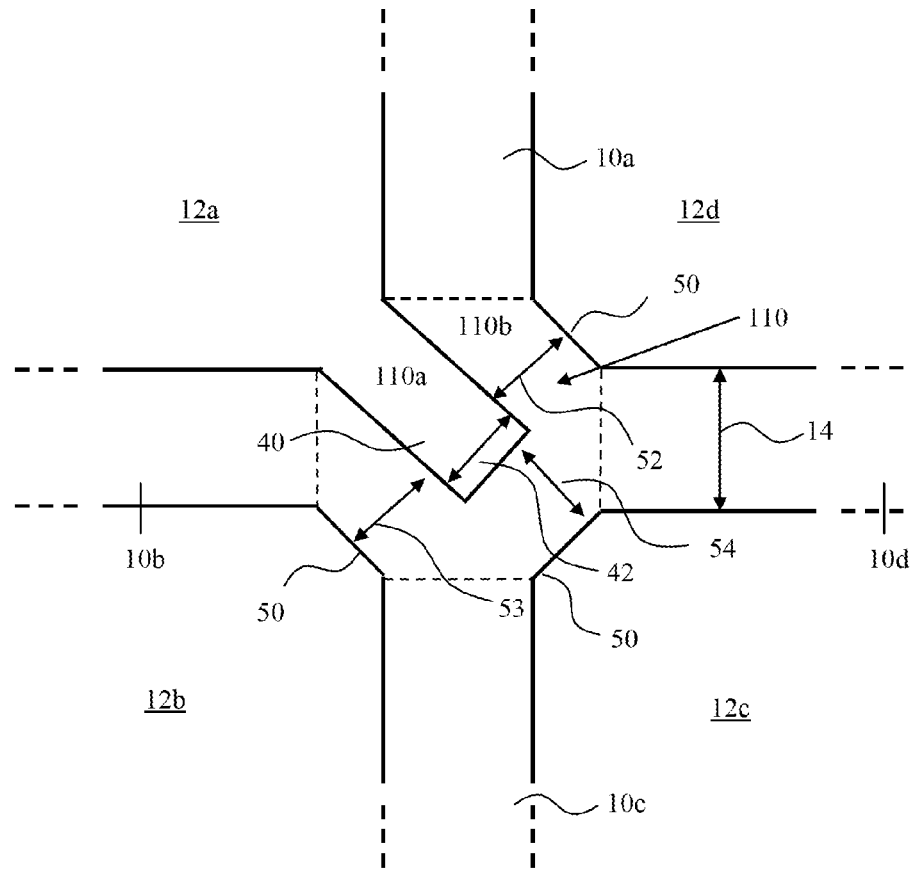
FIG. 5 is a further example of an intersection of insulation trenches with chamfered corners and rectangular intersection web, which is formed according to another aspect of the invention.

A further example of embodiment is shown in FIG. 5. As opposed to FIG. 4 the corners 50 of the insulated islands 12 are chamfered. The width 52 of the trench 110*b* in the intersection area and/or the intersecting area 110 is larger than in the arrangement shown in FIG. 4, however it is not larger than the width 14. Accordingly, all advantages regarding the necessary layer thickness of the filling layer are still valid.

Due to the chamfer an excessive electrical field applied to the "corner zones" (which are no longer any corners as such) of the insulated islands 12 is avoided. The voltage stability of an island 12 to the adjacent island is increased.

Figure 6:
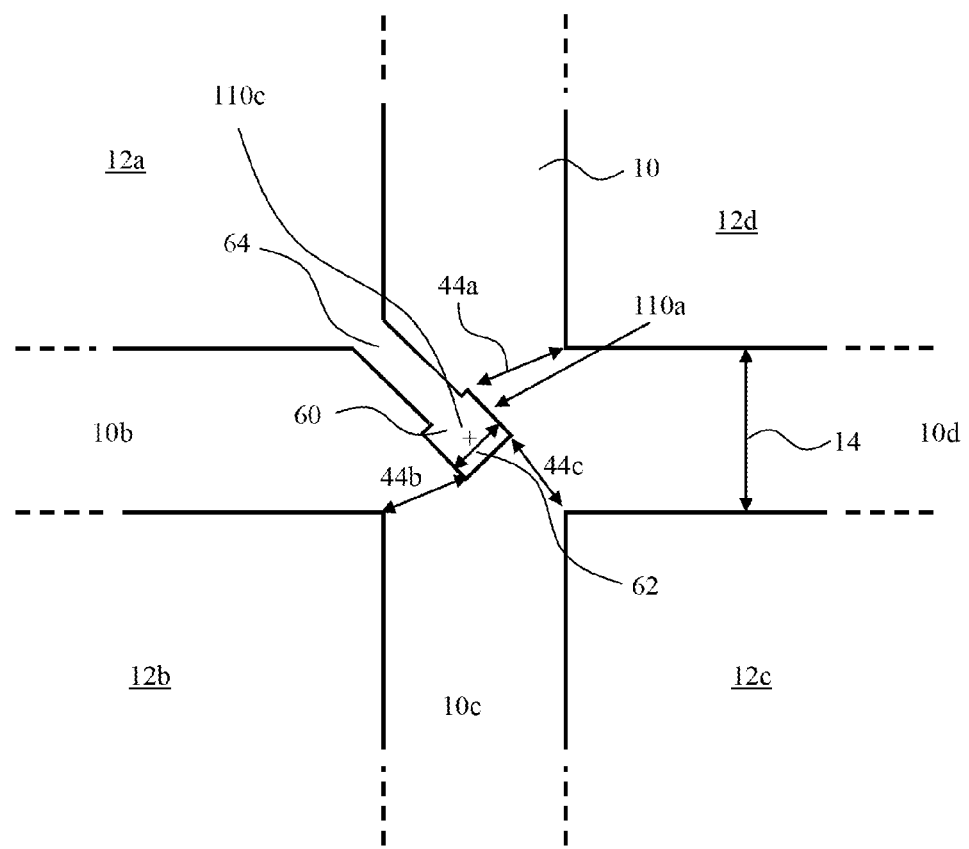
FIG. 6 is a further example of an intersection of insulation trenches with pointed corners and intersection web with differently broad parts, which is formed according to yet another aspect of the invention.
Figure 7:
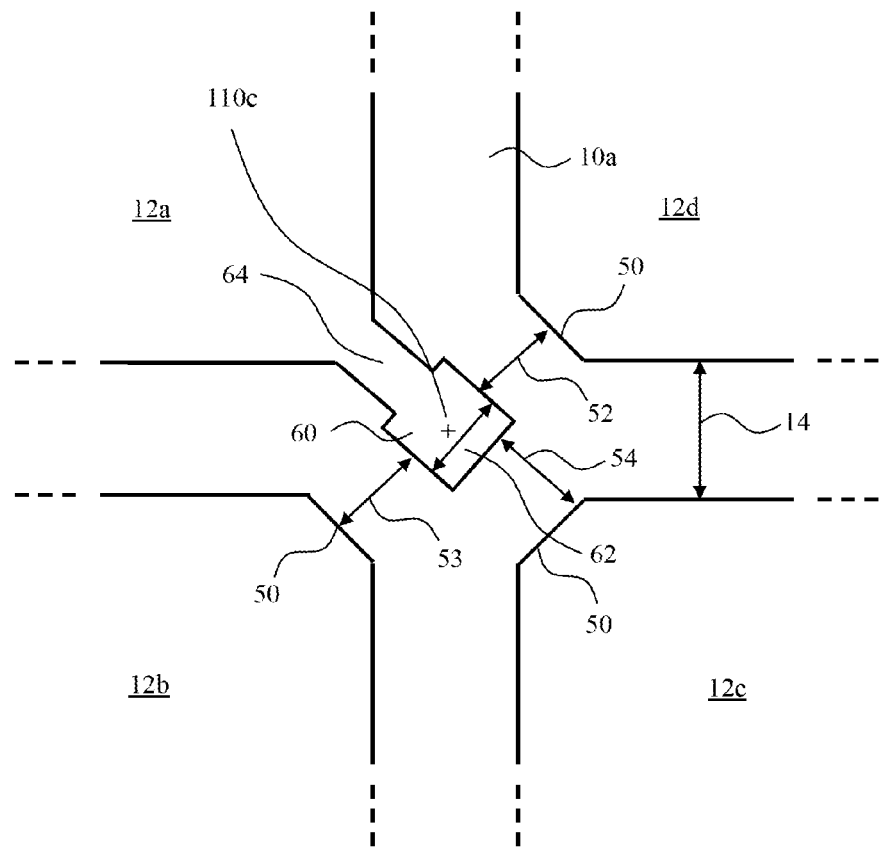
FIG. 7 is a further example of an intersection of insulation trenches with flattened corners and intersection web with differently broad parts, which is formed according to still yet another aspect of the invention.

Further examples are shown in FIGS. 6 and 7. They differ from the intersection structures of insulation trenches with a homogeneous web width 42, which are shown in FIGS. 4 and 5, by different web widths in the area 110*a* in the center of the intersection. Thus, the width 62 in the center, i.e. around the center 110*c*, of a part 60 of the area 110*a* is largest and is smaller in a connection piece 64 towards the insulated island 12*a*. The peninsula at the island 12*a* experiences a geometrical design, but, nevertheless, has a minimum length as reaching "up to the center".

This design is shown for "90° corners" in FIG. 6, FIG. 7 showing the corresponding arrangement with the chamfered "corners" 50. Roundings of the corner zones are also possible.

Figure 8:
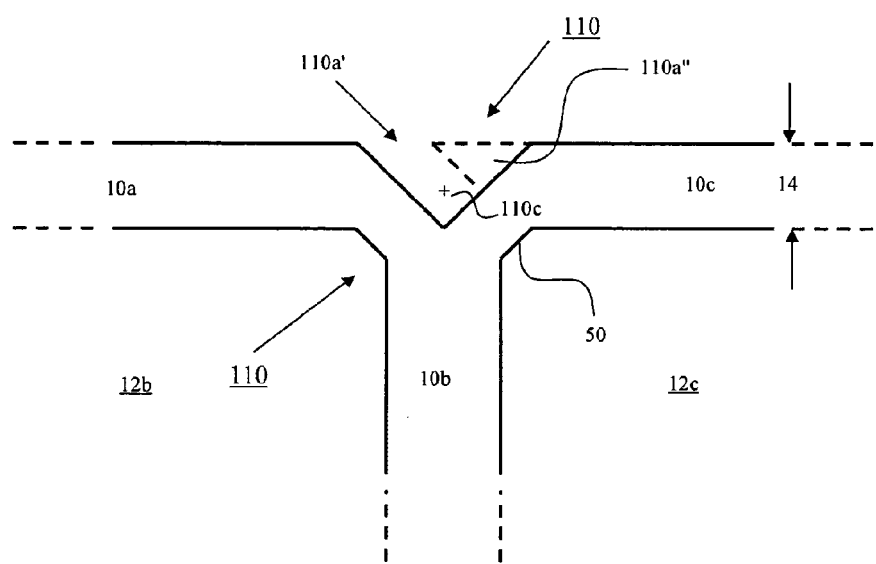
FIG. 8 is a meeting point of three insulation trenches in the form of a junction formed according to a further aspect of the invention.

FIG. 8 shows an arrangement in which the intersecting area 110 may be considered as a junction. In this case three insulation trenches 10*a*, 10*b*, 10*c* lead into the area 110. Moreover, a central area is connected with the separated (laterally insulated) semiconductor area 12*f*, which is opposite to the end of the insulation trench 10*b*. As before, the central area contains the center 110*c*.

In one embodiment (continuous line) the central area 110*a"* is symmetrically formed to the central plane of the trench 10*b*. In other embodiments (broken line) the central area 110*a'* is provided as a web oriented towards the area 12*c*.

Figure 8A:
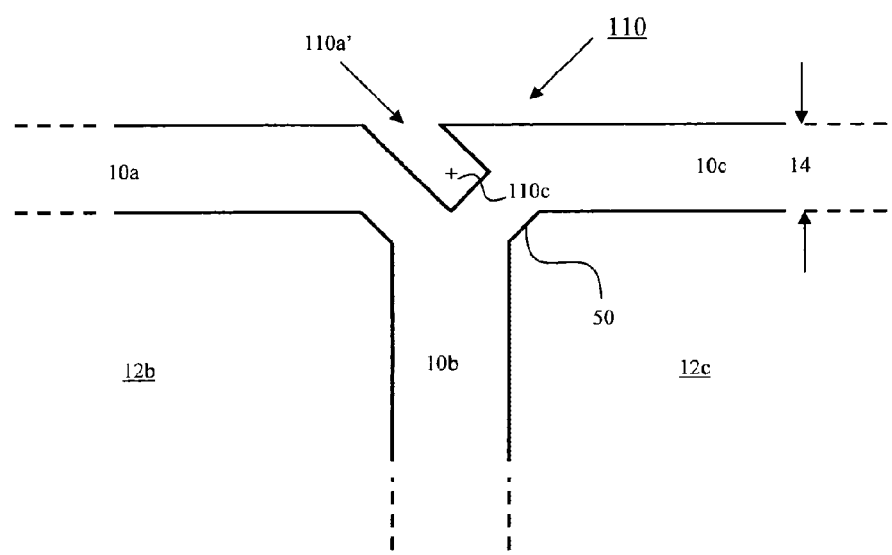
FIG. 8a, 8b are extracts from FIG. 8.
Figure 8B:
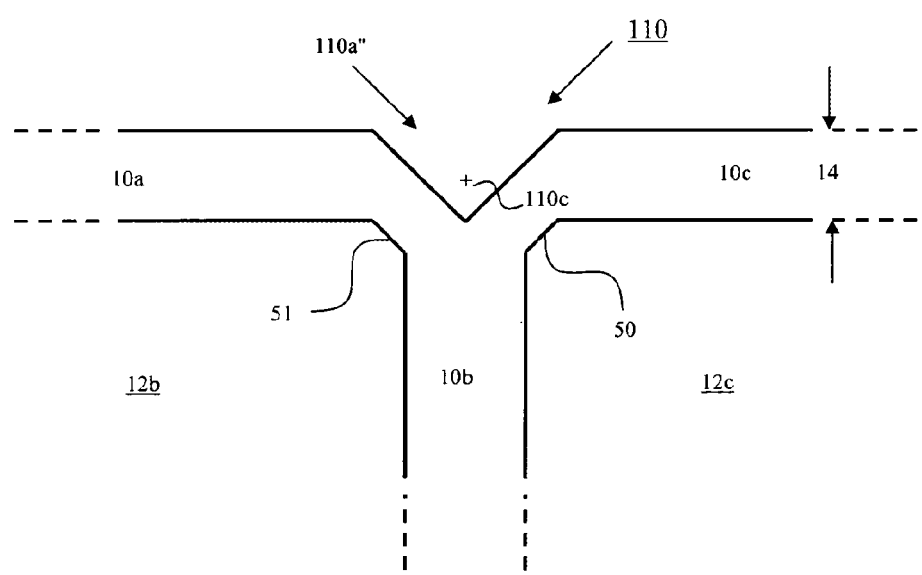

FIGS. 8*a*, 8*b* show the two forms of FIG. 8 in individual Figs.

A suitable form of the central area can be selected here, e.g. in the form of a triangle as this is represented in FIG. 8*b*. Other forms may also be used, which have a web-like portion or a connection part as this is shown as portion 64 in FIG. 7 so that this web-like portion is oriented towards the longitudinal direction of the insulation trench.

In other variants an end area is provided in addition to the web-like portion (corresponding to the portion 64), e.g. in the form of the portion 60 of FIG. 7. In this case the central area 110*a* extends in the form of a web (as a connection piece) and an end area (comparable to the portions 64 and/or 60 of FIG. 7) from the semiconductor area 12*a* (at least) to the center so that the center 110*c* is located in the connection piece or in the end area of the central area 110*a* as this is explicitly represented for a triangle in FIG. 8*b*.

In other embodiments (broken line) the area is provided as a web or a web with an end area with a larger lateral dimension, which is not symmetrically designed with respect to the central line of the trench 10*b*, but extends in a bent fashion. The web extends in a bent fashion to the trench 10*b*, e.g. with an inclination of 45° in the shown example.

Figure 8C:
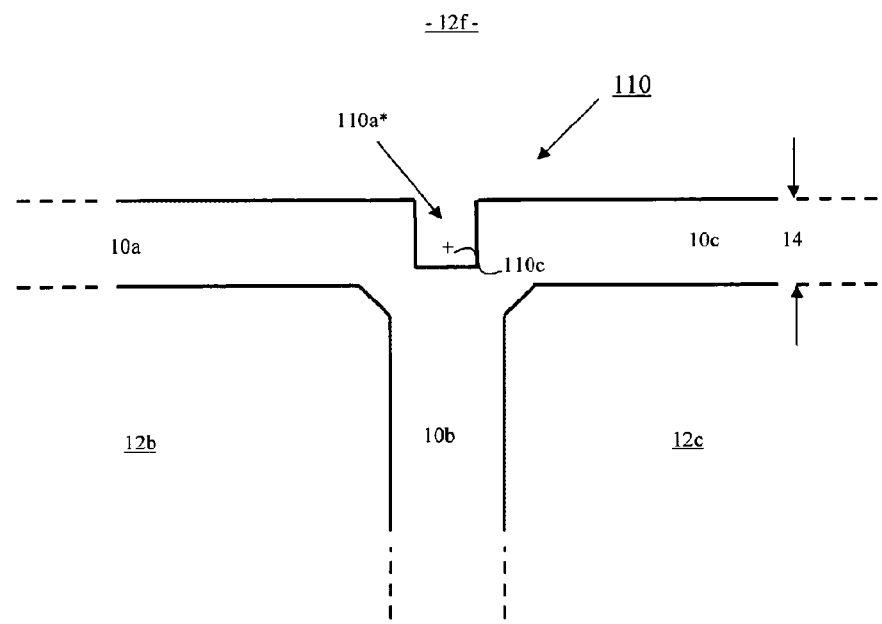
FIG. 8c is a further example of a central semiconductor area 110a* at a junction formed according to an additional aspect of the invention.

FIG. 8*c* shows another form. Here the web 110*a\** is provided as a portion extending in the longitudinal direction of the trench. It is rectangular and extends in a straight line (in the Fig. downwards to the trench 10*b*). This arrangement, as well, is symmetrical to the central plane of the trench 10*b* as the triangle of FIG. 8*b*.

Due to the reduction of the width in the intersecting area 110 as an intersection area or as a junction area it is achieved that the gap width maximally occurring and having to be filled is clearly reduced, preferably it is smaller than half the width of the insulation trenches. Thus, a thickness of the filling layer is only still required for the complete filling, which corresponds to half the width 14. Due to this, all of the insulation trenches and the intersecting area can be completely filled with a smaller thickness of the deposited filling layer. A "narrower" trench, in turn, means a shorter process time for the deposition, but also a shorter process time for the subsequent planarization during which less material must be removed. Either has a reducing effect on the error rate and the process costs.

A further embodiment relates to a geometrical design in the form of a layout of a semiconductor component with a high aspect ratio in the SOI technology for active layers in the range of larger than 50 μm, an intersection web 40 projecting into the center of the intersection from one corner of the intersection, which is connected with one of the insulated islands 12 at one corner of the intersection, while the corners of the three other insulated islands 12 of the intersection are separated from this web by the insulation trench 10. The width of the insulation trench 10 in the area of the intersection web is smaller or of equal size, based on the width 14 of the insulation trench 10 outside the intersection.

In a further development of the preceding embodiment the insulated islands 12 have "pointed" corners (90° corners) at the points of intersection and the intersection web 40 has a rectangular shape with the width 42. The distances 44*a* to 44*c* between the pointed corners of the insulated islands 12 and the pointed corners of the intersection web 40 are smaller or of equal size, based on the width 14 of the insulation trench 10.

In a further embodiment the insulated islands 12 are chamfered at the points of intersection and the intersection web 40 has a rectangular shape with the width 42, the chamfers 50 extending in parallel to the straight sides of the intersection web 40 and the widths of the trenches in the intersection area 42, 52, 53 between the chamfers 50 of the insulated islands 12 and the straight sides of the intersection web 40 are smaller or of equal width, based on the width 14 of the insulation trench 10.

In a further embodiment the insulated islands 12 have "pointed" corners (90° corners) at the points of intersection and the intersection web has an inhomogeneous width in such a fashion that the web part 60 located in the center of the intersection has square or rectangular shape with the width 62 and passes over into a narrower web part 64 and the distances 44*a* to 44*c* between the pointed corners of the insulated islands 12 and the pointed corners of the intersection web part 60 being smaller or of equal size, based on the width 14 of the insulation trench 1.

In a further embodiment the insulated islands 12 are chamfered at the points of intersection and the intersection web has an inhomogeneous width in such a fashion that the web part 60 located in the center of the intersection has a square or rectangular shape with a width 62 and passes over into a narrower web part 64 and the chamfers of the corners 50 extend in parallel to the straight sides of the intersection web part 60 and the widths of the trenches in the intersection area 52 to 54 between the chamfers of the corners 50 of the insulated islands 12 and the straight sides of the intersection web part 60 are smaller or of equal size, based on the width 14 of the insulation trench 10.

A further embodiment relates to a geometrical design or a layout of a junction of insulation trenches with a high aspect ratio of the SOI technology for active layers in the range of about ≧50 μm. Here, the insulated island 12 located opposite to the part of the joining insulation trench has a web-like bulge at that point which is located opposite to the center of the part of the joining insulation trench which reduces the width of the insulation trench 10 in the area of the intersection.

In a further development of the preceding embodiment the shape of the web-like bulge is adapted to the shape of the corners of the insulated islands 12.

We claim:

1. A semiconductor component having at least four straight insulation trenches formed in a semiconductor material, wherein semiconductor areas are laterally insulated from each other, each straight insulation trench having a uniform width along a longitudinal direction thereof, represented by a central line the semiconductor component comprising:
    an intersecting area wherein four of the straight insulation trenches meet, a center of the intersecting area being a point of intersection of four continuations of the four central lines;
    a central semiconductor area disposed in the intersecting area and physically connected with one of the semiconductor areas laterally insulated from each other; and
    wherein the central semiconductor area contains the center of the intersecting area and the point of intersection.

2. The semiconductor component according to claim 1, wherein the insulation trenches have a ratio of trench depth to trench width, which is ten or higher.

3. The semiconductor component according to claim 1, wherein a thickness of the semiconductor material is 50 μm or more.

4. The semiconductor component according to claim 1, further comprising a buried insulation layer on which the semiconductor material is formed.

5. The semiconductor component according to claim 1, wherein a maximum distance of the central semiconductor area from each of the semiconductor areas laterally separated from each other is smaller than half the width of one of the joining insulation trenches with the maximum width.

6. The semiconductor component according to claim 5, wherein all insulation trenches have the same width.

7. The semiconductor component according to claim 1, wherein the intersecting area is an intersection into which four insulation trenches lead or at which they meet.

8. The semiconductor component according to claim 7, wherein the central semiconductor area is an intersection web that starts from one corner of the intersection, projects into the center of the intersection, and is connected with one of the semiconductor areas laterally separated from each other at one corner of the intersection, whereas the corners of the three other semiconductor areas laterally separated from each other are separated by the intersection web in the intersection.

9. The semiconductor component according to claim 8, wherein the semiconductor areas laterally separated from each other have pointed corners at the intersection and the intersection web has a rectangular shape with a width and distances between the pointed corners of the semiconductor areas laterally separated from each other and the pointed corners of the intersection web that are smaller or of equal size, based on the width of the insulation trench.

10. The semiconductor component according to claim 7, wherein the semiconductor areas laterally separated from each other are chamfered in the intersection and the central semiconductor area as an intersection web has a rectangular shape with a width, wherein the chamfers to the straight sides of the intersection web extend in parallel and distances in the intersection between the chamfers of the semiconductor areas laterally separated from each other and the straight sides of the intersection web are smaller or of equal size, based on a width of the insulation trench.

11. The semiconductor element according to claim 7, wherein the semiconductor areas laterally separated from each other have pointed corners at the intersection and the central semiconductor area as an intersection web has an inhomogeneous width wherein a web portion located in a center of the of the intersection has a square or rectangular shape having a width that changes into a narrower web portion and distances between the pointed corners of the semiconductor areas are laterally separated from each other and pointed corners of the intersection web are smaller or of equal size, relative to a width of the insulation trench.

12. The semiconductor component according to claim 7, wherein the semiconductor areas which are laterally separated from each other are chamfered in the intersection and the central semiconductor area in the form of an intersection web has an inhomogeneous width in such a fashion that a web part located in the center of the intersection has a square or rectangular shape with a width that changes into a narrower web part and the chamfers extend in parallel to the straight sides of the intersection web part and the distances in the intersection between the chamfers of the semiconductor areas laterally separated from each other and the straight sides of the intersection web part are smaller or of equal size, based on a width of the insulation trench.

13. The semiconductor component according to claim 1, wherein a shape of a front end of the central semiconductor area is adapted to a shape of at least one corner of one of the semiconductor areas laterally separated from each other.

14. The semiconductor component according to claim 1, wherein the central semiconductor area is an intersection web which is only connected with one of the semiconductor areas insulated from each other.

15. The semiconductor component according to claim 14, wherein the inclusion of the center of the intersecting area corresponds to a projection of the central semiconductor area into the intersecting area.

16. The semiconductor component according to claim 1, wherein the inclusion of the center of the intersecting area corresponds to a projection of the central semiconductor area into the intersecting area.

17. The semiconductor component according to claim 1, wherein the other semiconductor areas are spaced from the central semiconductor area.

18. The semiconductor component according to claim 17, wherein the spacing is provided in the intersecting area.

19. The semiconductor component according to claim 2, wherein a thickness of the semiconductor material is 50 μm or more.

20. A design structure for a semiconductor component comprising semiconductor material, wherein the semiconductor component is provided as having at least four straight insulation trenches formed in the semiconductor material and comprising semiconductor areas laterally insulated from each other, each straight insulation trench having a uniform width along a longitudinal direction thereof, represented by a central line and the design structure comprising:
    an intersecting area receiving four of the straight insulation trenches, a center of the intersecting area being defined as a point of intersection of continuations of the center lines of the insulation trenches;
    a central semiconductor area disposed in the intersecting area and connected with one of the semiconductor areas laterally insulated from each other; and wherein the central semiconductor area contains the center of the intersecting area.

* * * * *